United States Patent
Breithaupt

(10) Patent No.: US 10,309,991 B2
(45) Date of Patent: Jun. 4, 2019

(54) CABLE HAVING A DECOUPLED SHIELD WIRE AND METHOD FOR DECOUPLING A SHIELD WIRE OF A CABLE

(71) Applicant: Robert Bosch GmbH, Stuttgart (DE)

(72) Inventor: Joachim Breithaupt, Schwieberdingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 16/135,199

(22) Filed: Sep. 19, 2018

(65) Prior Publication Data

US 2019/0086445 A1 Mar. 21, 2019

(30) Foreign Application Priority Data

Sep. 20, 2017 (DE) .................. 10 2017 216 647

(51) Int. Cl.
*G01R 15/14* (2006.01)
*H01R 13/648* (2006.01)

(52) U.S. Cl.
CPC ......... *G01R 15/148* (2013.01); *H01R 13/648* (2013.01)

(58) Field of Classification Search
CPC ............................ G01R 15/148; H01R 13/648
USPC .......................................................... 174/78
See application file for complete search history.

(56) References Cited

U.S. PATENT DOCUMENTS

| 4,386,819 A * | 6/1983 | Asick | H01R 9/032 439/607.47 |
| 2008/0207057 A1* | 8/2008 | Akino | H01R 9/0518 439/607.41 |
| 2014/0335732 A1* | 11/2014 | Oberski | H01R 13/6467 439/626 |
| 2016/0203887 A1* | 7/2016 | Wiemeyer | H01R 13/7197 174/74 R |

FOREIGN PATENT DOCUMENTS

| CN | 202949520 U | 5/2013 |
| CN | 203014113 U | 6/2013 |
| WO | 2014053147 A1 | 4/2014 |

* cited by examiner

*Primary Examiner* — Timothy J Thompson
*Assistant Examiner* — Charles Pizzuto
(74) *Attorney, Agent, or Firm* — Norton Rose Fulbright US LLP; Gerard Messina

(57) ABSTRACT

A method for decoupling a shield wire of a cable having at least one signal line and the shield wire disposed around the signal line, the shield wire being completely cut through at a decoupling point along the run direction of the cable in a circumferential direction. A first crimp barrel is disposed on the cable on a first side of the decoupling point to electrically connect the first crimp barrel to the shield wire on the first side of the decoupling point. A second crimp barrel is disposed on the cable on a second side of the decoupling point to electrically connect the second crimp barrel to the shield wire on the second side of the decoupling point. A capacitive bridging of the shield wire across the decoupling point is created in such a way that the first crimp barrel and the second crimp barrel are capacitively coupled.

14 Claims, 4 Drawing Sheets

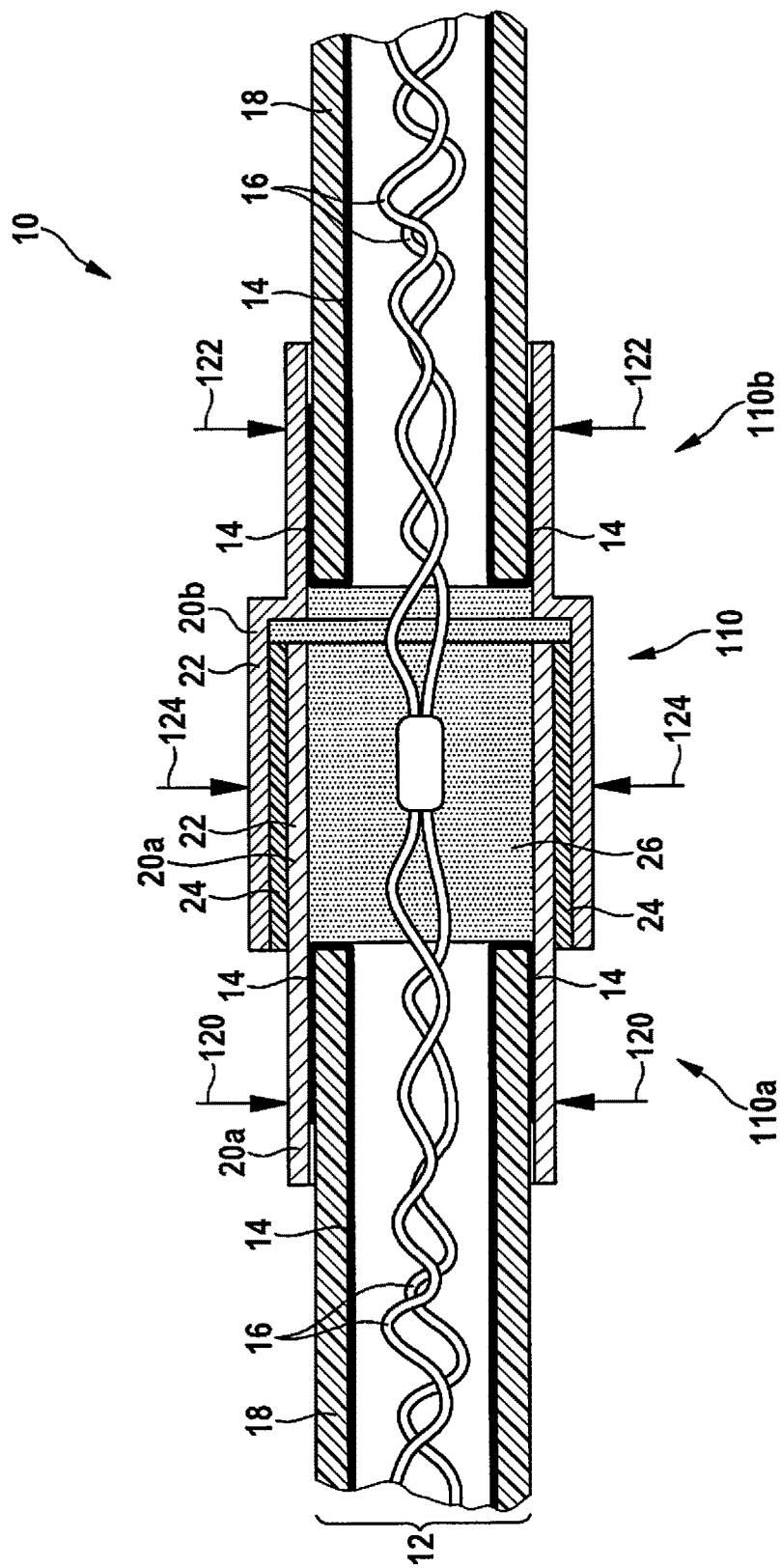

CABLE HAVING A DECOUPLED SHIELD WIRE AND METHOD FOR DECOUPLING A SHIELD WIRE OF A CABLE

CROSS REFERENCE

The present application claims the benefit under 35 U.S.C. § 119 of German Patent Application No. DE 102017216647.9 filed on Sep. 20, 2017, which is expressly incorporated herein by reference in its entirety.

FIELD

The present invention relates to a method for decoupling a shield wire of a cable and to an assemblage made up of a cable and a decoupling device. The present invention thus lies particularly in the area of cables, electrical connectors and electrical conductors.

BACKGROUND INFORMATION

Cables are frequently equipped with one or multiple inner (electrical) signal lines and a shield wire developed coaxially around these signal lines. The shield wire is supposed to reduce or entirely prevent electromagnetic influences on the signal line(s) so that interferences in the signal transmission through the signal line(s) can be reduced or avoided.

For better shielding, the shield wire may be connected in such a way that it is at ground potential. There may be situations, however, where the two ends of the cable are connected in such a way that the shield wire via the two ends is connected to different grounded connections. This may have the disadvantage that a connection of the shield wire to different ground potentials may result in a usually undesired flow of current (a so-called sheath current) across the shield wire, which may result in undesired effects and in a degradation of the shielding of the signal lines.

To avoid such a flow of current across the shield wire, different possibilities are known in the related art for decoupling (i.e. galvanic isolation) of the shield wire, for example sheath current filters, for which circuit boards having fitted discrete components may be used. Using these components, it is possible to interrupt the shield wire and reconnect it in accordance with the requirements in such a way that a flow of current in the shield wire may be prevented. The circuit board and the components required for this purpose may be installed in a housing and/or extrusion coated and/or embedded in the cables.

This usually requires considerable additional space, however. It may also be the case that some methods for running electrical lines cannot be used with such decoupling, for example a method of pulling electrical lines through, since the additional components for decoupling the shield wire are often significantly larger than the cross section of the cable and may resist being pulled through. Furthermore, these additional components usually require substantial procurement costs and increase the manufacturing effort required for the cable so that the manufacturing costs for the cable are increased.

SUMMARY

The present invention provides a method for decoupling a shield wire and an assemblage made up of a cable and a decoupling device. Advantageous developments of the present invention are described herein.

The present invention makes use of the measure of galvanically isolating a shield wire at a decoupling point and capacitively to couple the two ends thus produced by using crimp barrels. The present invention thus produces a method and a device that make it possible to decouple, i.e., galvanically isolate, a shield wire of a cable reliably and with little manufacturing effort.

In a first aspect, the present invention relates to a method for decoupling a shield wire of a cable having at least one signal line and the shield wire disposed around the at least one signal line. The method comprises the step of cutting the shield wire at a decoupling point along the direction in which the cable is run in such a way that the shield wire is entirely cut through in a circumferential direction. The method furthermore comprises positioning a first crimp barrel on the cable on a first side of the decoupling point in such a way that the first crimp barrel is electrically connected to the shield wire on the first side of the decoupling point, the first crimp barrel being designed to be at least partially electrically conductive, and positioning a second crimp barrel on the cable on the second side of the decoupling point in such a way that the second crimp barrel is electrically connected to the shield wire on the second side of the decoupling point, the second crimp barrel being designed to be at least partially electrically conductive. The method additionally comprises a production of a capacitive bridging of the shield wire across the decoupling point in such a way that the first crimp barrel and the second crimp barrel are capacitively coupled.

In another aspect, the present invention relates to an assemblage made up of a cable with at least one signal line and a shield wire disposed around the at least one signal line, and a decoupling device. The decoupling device has a first crimp barrel, which is designed to be electrically conductive and which is situated on the cable on a first side of the decoupling point, at which the shield wire is entirely cut through in a circumferential direction, in such a way that the first crimp barrel is electrically connected to the shield wire on the first side of the decoupling point, as well as a second crimp barrel, which is designed to be electrically conductive and which is situated on the cable on a second side of the decoupling point in such a way that the second crimp barrel is electrically connected to the shield wire on the second side of the decoupling point. The decoupling device additionally comprises a bridging element, which is designed to bridge the shield wire across the decoupling point in such a way that the first crimp barrel and the second crimp barrel are capacitively coupled.

Decoupling the shield wire means that the shield wire is designed in such away that no electrical direct current is able to flow across the shield wire at the decoupling point, while the shielding effect of the shield wire is maintained at least partially, preferably entirely. Accordingly, the decoupling point is a point or position along the direction in which the cable is run, at which the electrical conductivity of the shield wire is interrupted, while the shielding effect is at least partially maintained. For this purpose, the shield wire is preferably cut through in such a way that there no longer exists a direct electrical connection of the two separated parts of the shield wire, in particular not for electrical direct current.

The run direction is a direction of the cable, in which the cable extends.

A crimp barrel may preferably be designed in such a way that in its initial state it may be slid and/or positioned over the cable and may be firmly connected to the cable by crimping. For example, the crimp barrel may be designed as a squeeze barrel and crimping may comprise a squeezing together, preferably in the radial direction perpendicular to the run direction of the cable. The crimp barrel being designed to be least partially electrically conductive means that the crimp barrel does not necessarily have to be made entirely from conductive material. The crimp barrel may have conductive and non-conductive areas. Nevertheless, the crimp barrel is designed to contact the shield wire electrically, which is why a contact surface of the crimp barrel with the shield wire must be designed to be at least partially conductive.

A capacitive bridging of the shield wire across the decoupling point means that the parts of the shield wire that are separated at the decoupling point so as to be non-conductive for electrical direct current are capacitively coupled to one another directly or indirectly.

The present invention offers the advantage that an undesired flow of current across the shield wire may be prevented reliably. It is thus possible reliably to avoid compensating currents, which could be caused for example by the fact that the two ends of the shield wire along the run direction are at different potentials. The present invention also offers the advantage that it is possible to achieve a mechanically robust and durable decoupling. The decoupling makes it possible to avoid in particular damage and/or heating of the shield wire and the occurrence of power loss.

The present invention furthermore offers the advantage that it is possible to provide the decoupling of the shield wire in a cost-effective manner since according to the invention no circuit boards and/or passive components such as capacitors, for example, are required for the decoupling. This makes it possible to reduce the manufacturing costs of the cable.

The present invention additionally offers the advantage that the decoupling of the shield wire can be achieved in a spatially more compact manner and that thus a cable having the decoupling of the present invention has smaller spatial extensions at the decoupling point than is conventionally the case. This may additionally offer the advantage that a cable of the present invention may be laid out using methods such as pulling through, which cannot be used for shield wires decoupled in a conventional manner. In this manner, it is in particular possible to lay out and install a cable of the present invention in vehicles and/or in industrial facilities within a shorter period of time than is possible in conventionally decoupled shield wires.

The present invention furthermore offers the advantage that it is not necessary to cut through and reconnect the at least one signal line for decoupling the shield wire, in order to decouple the shield wire. This makes it possible to simplify, accelerate and reduce the cost of the manufacturing method. Moreover, disadvantages for the signal transmission through the at least one signal line across the decoupling point are avoided since the at least one signal line may preferably run through the decoupling point preferably without interruption and without contact point. This makes it possible to avoid disadvantages for an impedance curve of the at least one signal line.

The present invention additionally offers the advantage that the decoupling device is able to achieve a traction relief in the axial direction, i.e., in the run direction of the cable, at the decoupling point, since the cable sheath ends ultimately are connected via the crimp barrels in a traction-transmitting manner. This allows for a mechanical stabilization of the decoupling point or the cable.

The present invention additionally offers the advantage that the shield wire may be decoupled in an entirely automated or mechanical fashion. This makes it possible to reduce manufacturing costs and manufacturing time. Furthermore, the decoupling may also be performed in the case of cables that are already laid out, without necessitating a removal of the cable.

The shield wire is preferably bridged capacitively using a third crimp barrel, which respectively encloses the first crimp barrel, the second crimp barrel and the decoupling point at least partially. The bridge element may preferably comprise the third crimp barrel or may be designed as such so that the bridge element is designed separately from the first and the second crimp barrel. This preferably allows for a capacitive coupling of the third crimp barrel with the first crimp barrel and the second crimp barrel. In particular, it is possible for the first and/or the second crimp barrel to be respectively designed as sub-crimp barrels, which are developed for example in the decoupling device within and/or below the third crimp barrel and/or are enclosed by the latter. This offers the advantage that the decoupling device may be manufactured in a particularly simple manner and/or with particularly little effort. In particular, it is preferably possible to design the first crimp barrel and the second crimp barrel to be identical or similar, which simplifies the manufacture of the decoupling device and its components.

Between the first crimp barrel and the third crimp barrel, and, respectively, between the second crimp barrel and the third crimp barrel, an isolator element may preferably be disposed, which electrically insulates the first crimp barrel, and, respectively, the second crimp barrel, from the third crimp barrel so that no electric direct currents are able to flow between the first crimp barrel or the second crimp barrel and the third crimp barrel. The isolator element may be designed for example as an electrically insulating and/or dielectric film. Particularly preferably, the first crimp barrel and/or the second crimp barrel may be equipped with the isolator element, the isolator element may be wound around the first crimp barrel and/or the second crimp barrel, before the third crimp barrel is attached.

Preferably, it is possible to achieve the measure of decoupling and of the capacitive coupling by way of a thickness of the isolator element, which may be produced for example by varying a number of windings of an isolator element designed as a dielectric film. This thus offers another degree of freedom in the design of the decoupling device or the cable.

Preferably, prior to mounting the first and/or the second crimp barrel, an electrically insulating filler material and/or a shrink tube may be disposed around the signal line. This may offer the advantage of being able to insulate the signal line reliable from the crimp barrels and/or from the shield wire.

According to another preferred specific embodiment, the second crimp barrel is disposed in such away that the second crimp barrel encloses the first crimp barrel at least partially. For this purpose, the bridge element is developed as apart of the first crimp barrel and/or as a part of the second crimp barrel. This offers the advantage that the first and the second crimp barrel may be sufficient to enclose the decoupling point and to decouple the shield wire. A third crimp barrel, which encloses for example the first and the second crimp barrel, is not required in this instance. Preferably, the decoupling point is at least partially covered or enclosed by both the first as well as by the second crimp barrel. An arrangement of this kind is in particular able to achieve a capacitive coupling between the first crimp barrel and the second crimp barrel so that the creation of the capacitive bridging of the shield wire does not require a further crimp barrel.

The shield wire is preferably cut through in such a way that an insulating layer of the cable situated between the at least one signal line and the shield wire and/or the at least one signal line of the cable is at least not cut through completely. This offers the advantage that no disconnecting points and/or connecting points, at which the signal line was cut and possibly reconnected, arise, which may be disadvantageous for the signal transmission properties. This thus allows for a reduction of losses in the signal transmission. It may be advantageous that the decoupling device or its components are designed in such a way that they may be disposed on the cable around the decoupling point, without it being necessary to cut through the signal line.

Preferably, the first crimp barrel and/or the second crimp barrel and/or the bridge element are able to be opened in the circumferential direction so that they are able to be attached around the cable in a direction perpendicular to the run direction of the cable. This may be achieved for example in that the decoupling device or its components are designed to accommodate the cable via a laterally developed opening, for example. This offers the advantage that the decoupling device and in particular the crimp barrels do not have to be slid from one end of the cable to the decoupling point, but may be plugged directly over the cable at the decoupling point.

Furthermore, this offers the advantage that it is not necessary to remove plugs and/or sockets possibly situated at the ends of the cable in order to slide the decoupling device or the crimp barrels over an end of the cable. This makes it possible to reduce the effort required for installing the decoupling device.

The first crimp barrel and/or the second crimp barrel and/or the bridge element are preferably designed to be annular and/or cylindrical and/or arrangeable around the cable. This offers the advantage that the decoupling device entails an increase of the cross section of the cable at the decoupling point that is as small as possible. In particular, this may offer the advantageous effect that the cable may be laid out preferably using methods that could not be used if the cross section at the decoupling point were too large.

The method preferably further comprises an installation of a sealing elements, which covers the decoupling point and/or the first crimp barrel and/or the second crimp barrel at least partially in such a way that the shielding element protects the decoupling point and/or the first crimp barrel and/or the second crimp barrel against the ingress of contaminants and/or moisture. The sealing element may comprise for example a shrink tube, which may be disposed preferably around the decoupling device in order to achieve an even better electrical insulation and to prevent the ingress of moisture and/or contaminants.

The present invention preferably further comprises the installation of at least one seal, e.g. in the form of a sealing bead, between the crimp barrels and the cable and/or between crimp barrels situated on top of one another, the at least one seal being designed and situated so as to prevent the ingress of moisture and/or contaminants. This also makes it possible to achieve a further improvement of the electrical insulation and/or a mechanical stabilization of the decoupling point.

It is understood that the features mentioned above and the features described below may be used not only in the combination indicated in each case but also in other combinations or in isolation, without departing from the scope of the present invention.

The present invention is represented schematically in the figures in light of exemplary embodiments, and is described in detail below with reference to the figures.

BRIEF DESCRIPTION OF THE DRAWINGS

FIGS. 2A and 2B show a decoupling device according to a second preferred specific embodiment.

DETAILED DESCRIPTION OF EXAMPLE EMBODIMENTS

Figure 1A:
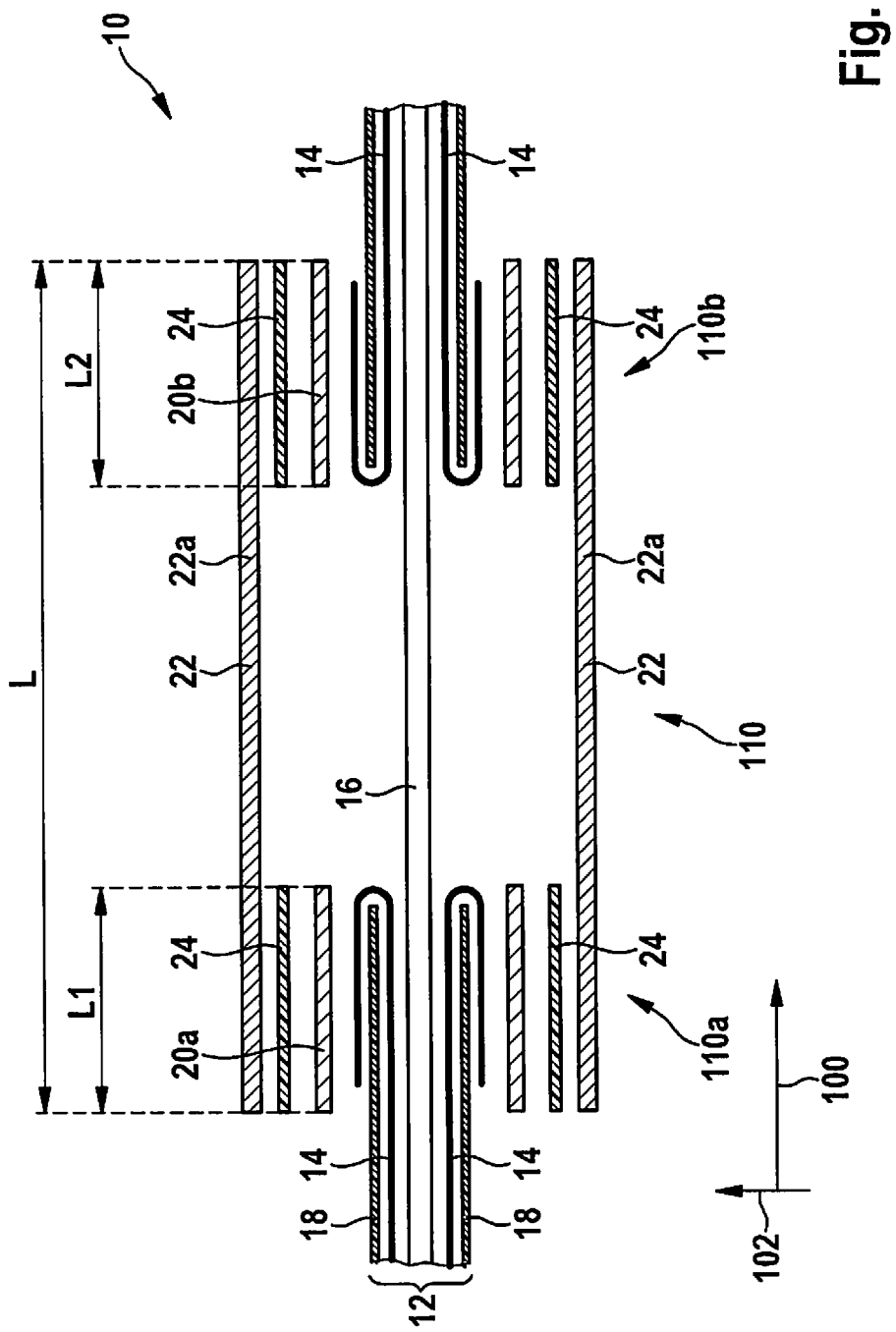
FIGS. 1A and 1B show in schematic representations a decoupling device according to a first preferred specific embodiment.

In a schematic longitudinal sectional drawing, FIG. 1A shows a decoupling device 10 according to a first preferred specific embodiment, which decouples a shield wire 14 of a cable 12 in such a way that no electrical direct currents are able to flow across shield wire 14. Aside from shield wire 14, cable 12 has at least one signal line 16, which is not cut through according to the shown preferred specific embodiment, as well as a cable sheath 18, which surrounds the at least one signal line 16 and the shield wire 14 and insulates these from the surroundings. It is possible for the electrical lead 12 to have one or several insulating filler materials (not shown) between the signal wire 16 and the shield wire 14 as well as optionally between shield wire 14 and cable sheath 18, in order electrically to insulate shield wire 14 from signal line 16.

Shield wire 14 is cut through at decoupling point 110 in a circumferential direction 102 along a run direction 100 of cable 12. Furthermore, shield wire 14 is folded over on the outside of cable 12 respectively in the direction facing away from decoupling point 110 so that there exists no electrical contact at decoupling point 110 between shield wire 14 on the first side 110a of decoupling point 110 and shield wire 14 on the second side 110b of decoupling point 110.

On first side 110a, the folded shield wire 14 is crimped or pressed together with a first crimp barrel 20a so that shield wire 14 is pressed against the outside of cable 12. On second side 110b, the folded shield wire 14 is crimped or pressed together with a second crimp barrel 20b so that shield wire 14 is pressed against the outside of cable 12. Crimp barrels 20a and 20b are designed to be at least partially electrically conductive so that an electrical contact exists between shield wire 14 and the respective crimp barrels 20a and 20b.

A bridge element 22 designed as a third crimp barrel 22a is disposed around the first and the second crimp barrel 20a and 20b in order to produce a bridge, an isolator element 24 being situated between the first crimp barrel 20a and the third crimp barrel 22a and, respectively, between the second crimp barrel 20a and the third crimp barrel 22a, which electrically insulates the first and second crimp barrels 20a and 20b, respectively, from the third crimp barrel 22a. Isolator element 24 is preferably designed a dielectric film. Isolator element 24 may be designed as one or multiple plies of a polyimide film of a thickness of approximately 50 μm to 200 μm. Two or more than two plies are preferred so that more safety is provided against puncture when crimping and that corresponding insulator voltages of preferably 500 V or more are achieved.

Bridge element 22 or third crimp barrel 22a has a length L along direction 100 and covers first and second crimp barrels 20a and 20b preferably completely, which have a length of L1 and L2, respectively. At the point at which first crimp barrel 20a overlaps with third crimp barrel 22a, a capacitive coupling is produced of first crimp barrel 20*a* with third crimp barrel 22*a* via the isolator element 24 designed as a dielectric film. Accordingly, at the point at which second crimp barrel 20*b* overlaps with third crimp barrel 22*a*, a capacitive coupling is produced of second crimp barrel 20*b* with third crimp barrel 22*a* via the isolator element 24 designed as a dielectric film. In this manner, it is possible to achieve an effective shielding of signal line 16 against electromagnetic influences even at decoupling point 110 and at the same time prevent a direct current from flowing through shield wire 14 across decoupling point 110 so that also no direct current is able to flow through shield wire 14 if the two ends of cable 12 should be at different electrical potentials.

Different sequences are possible for crimping the individual crimp barrels. Crimping the first crimp barrel 20*a* and second crimp barrel 20*b* and third crimp barrel 22*a* may occur for example respectively directly after positioning or mounting the respective crimp barrel 20*a*, 20*b* and 22*a*, i.e., so that the respective crimp barrel 20*a*, 20*b* and 22*a* are for example crimped with cable 12 immediately after having been positioned on cable 12. Alternatively, it is possible first to position all crimp barrels 20*a*, 20*b* and 22*a* on cable 12 and crimp them only subsequently when all crimp barrels 20*a*, 20*b* and 22*a* are situated on cable 12. It is also possible first to position the first and the second crimp barrels 20*a* and 20*b* on cable 12 and then to crimp both crimp barrels and subsequently to position the third crimp barrel 22*a* and crimp it.

It is in particular advantageous first to position all crimp barrels 20*a*, 20*b* and 22*a* on cable 12 and only subsequently to crimp all crimp barrels together.

This may be advantageous with a view to pressing together the entire decoupling device 10 in a form-locking manner.

Figure 1B:
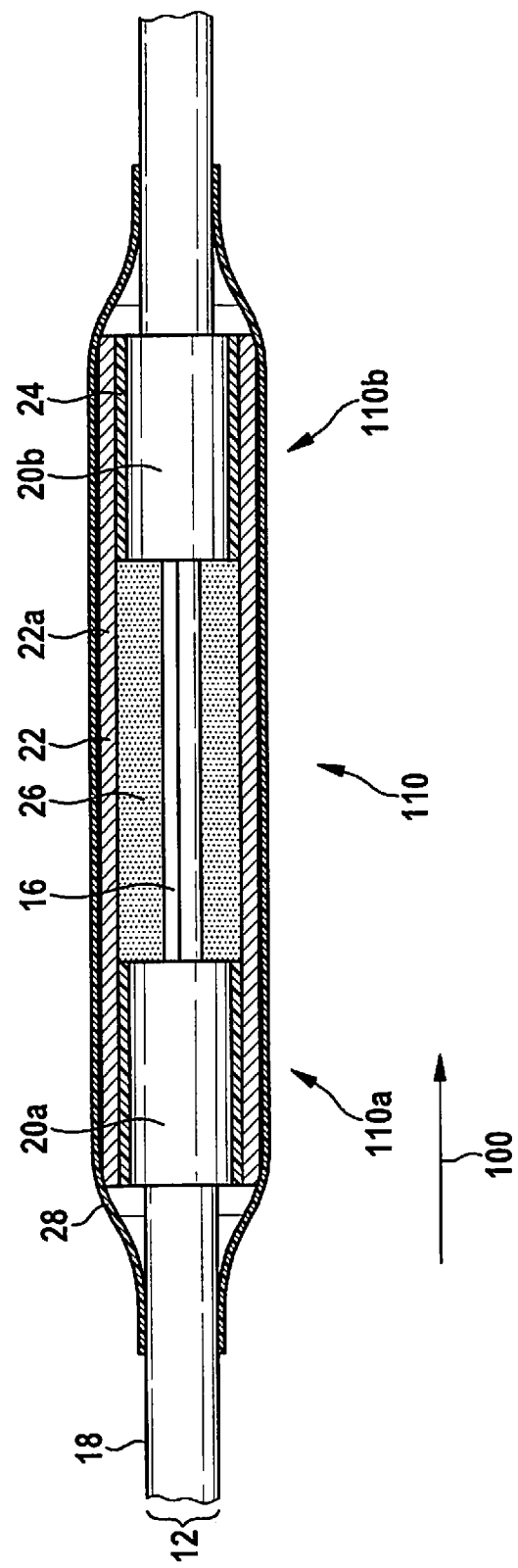

FIG. 1B shows another schematic representation of decoupling device 10 from FIG. 1A, in which the first and the second crimp barrels 20*a* and 20*b* are shown in a closed state. It may be seen that an insulating filler material 26 is disposed between signal line 16 and third crimp barrel 22*a*, which stabilizes the decoupling device and electrically insulates signal line 16 from crimp barrels 20*a*, 20*b* and 22*a*. Furthermore, a sealing element 28 is disposed around decoupling device 10 for further stabilization and sealing. According to this preferred specific embodiment, sealing element 28 is designed as a shrink tube.

Figure 2A:
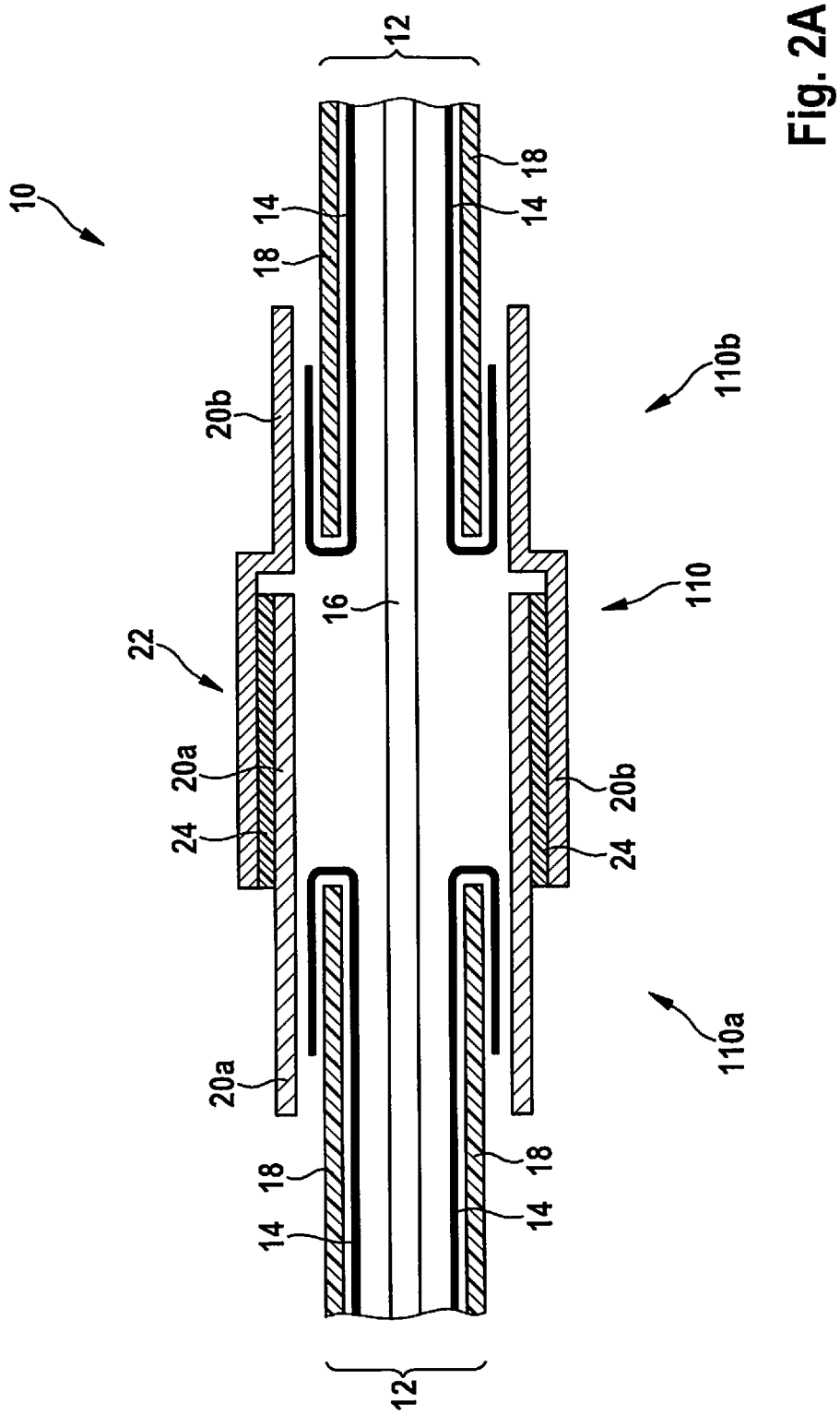

FIGS. 2A and 2B show a decoupling device 10 according to a second preferred specific embodiment. Decoupling device 10 has a first and a second crimp barrel 20*a* and 20*b* which also form the bridge element 22. In contrast to the first specific embodiment, no third crimp barrel is required in this preferred specific embodiment.

According this specific embodiment, first crimp barrel 20*a* and second crimp barrel 20*b* are designed differently. In particular, first and second crimp barrels 20*a* and 20*b* are designed in such a way that second crimp barrel 20*b* surrounds first crimp barrel 20*a* at least partially, particularly at decoupling point 110, so that bridge element 22 is formed at decoupling point 110 is formed directly by first crimp barrel 20*a* and second crimp barrel 20*b*, between which an isolator element 24 is situated, which may be designed as a dielectric film. In particular, isolator element 24 may be designed as one or multiple plies of a polyimide film of a thickness of approximately 50 µm to 200 µm.

Accordingly, a capacitive coupling is achieved directly between first and second crimp barrels 20*a* and 20*b*, which eliminates the necessity of providing a separate bridge element 22 or a third crimp barrel.

As may be seen in FIG. 2B, according to this specific embodiment, cable 12 has two signal lines 16. These were cut through at decoupling point 110 and reconnected to each other. This may serve the purpose of sliding crimp barrels 20*a* and 20*b* in a simple manner over decoupling point 110 onto cable 12, although other types of attachment that in particular do not require cutting through signal line 16 are also possible. The crimp barrels 20*a* and 20*b* situated on the cable are then crimped or pressed together with the cable in accordance with a first specific embodiment. First, first crimp barrel 20*a* is crimped or pressed together at position 120 so that first crimp barrel 20*a* is firmly connected to cable 12 and that an electrical contact exists with shield wire 14. Accordingly, second crimp barrel 20*b* is then positioned on second side 110*b* and is crimped with cable 12 at position 122. Subsequently, bridge element 22 formed by the two crimp barrels 20*a* and 20*b* is crimped at position 124. Here it may be advantageous if the interior of decoupling device 10 is filled with an insulating filler mass 26 in order to stabilize the decoupling device when pressure is applied when crimping at position 124 and to offer counterpressure when crimping.

According to a second specific embodiment, a joint crimping may only be performed when all crimp barrels have been positioned correctly with respect to one another.

What is claimed is:

1. A method for decoupling a shield wire of a cable having at least one signal line, the shield wired disposed around the at least one signal line, the method comprising:
    cutting the shield wire at a decoupling point along a run direction of the cable in such a way that the shield wire is completely cut through in a circumferential direction;
    positioning a first crimp barrel on the cable on a first side of the decoupling point in such a way that the first crimp barrel is electrically connected to the shield wire on the first side of the decoupling point, the first crimp barrel being at least partially electrically conductive;
    positioning a second crimp barrel on the cable on a second side of the decoupling point in such a way that the second crimp barrel is electrically connected to the shield wire on the second side of the decoupling point, the second crimp barrel being designed to be at least partially electrically conductive; and
    creating a capacitive bridging of the shield wire across the decoupling point in such a way that the first crimp barrel and the second crimp barrel are capacitively coupled.

2. The method as recited in claim 1, wherein the shield wire is bridged capacitively by a third crimp barrel, which respectively encloses the first crimp barrel and the second crimp barrel at least partially.

3. The method as recited in claim 2, further comprising:
    disposing an electrical isolator element at least one of: (i) between the first crimp barrel and the third crimp barrel, and/or (ii) between the second crimp barrel and the third crimp barrel.

4. The method as recited in claim 2, further comprising:
    disposing at least one seal at least one of: (i) between the first crimp barrel and the third crimp barrel, and/or (ii) between the second crimp barrel and the third crimp barrel, and/or (iii) between the first crimp barrel and the cable, and/or (iv) between the second crimp barrel and the cable.

5. The method as recited in claim 1, wherein the second crimp barrel is positioned in such a way that the second crimp barrel encloses the first crimp barrel at least partially.

6. The method as recited in claim 5, further comprising: disposing an electrical isolator element between the first crimp barrel and the second crimp barrel.

7. The method as recited in claim 5, further comprising: disposing at least one seal at least one of: (i) between the first crimp barrel and the second crimp barrel, and/or (ii) between the first crimp barrel and the cable, and/or (iii) between the second crimp barrel and the cable.

8. The method as recited in claim 1, wherein the shield wire is cut through in such a way that at least one of: (i) an insulating layer of the cable situated between the at least one signal line and the shield wire, and/or (ii) the at least one signal line of the cable are at least not cut through completely.

9. The method as recited in claim 1, further comprising: an installation of a sealing element, which covers at least one of: (i) the decoupling point, and/or (ii) the first crimp barrel, and/or (iii) the second crimp barrel, at least partially in such a way that the decoupling point is protected against an ingress of contaminants and/or moisture.

10. An assemblage made up of a cable having at least one signal line and a shield wire disposed around the at least one signal line, and a decoupling device, which comprises:
   a first crimp barrel which is electrically conductive and which is situated on the cable on a first side of a decoupling point, at which decoupling point the shield wire is cut through completely in a circumferential direction, in such a way that the first crimp barrel is electrically connected to the shield wire on the first side of the decoupling point;
   a second crimp barrel which is electrically conductive and which is situated on the cable on a second side of the decoupling point in such a way that the second crimp barrel is electrically connected to the shield wire on the second side of the decoupling point; and
   a bridge element which bridges the shield wire across the decoupling point in such a way that the first crimp barrel and the second crimp barrel are capacitively coupled.

11. The assemblage as recited in claim 10, wherein the bridge element is part of at least one of: (i) the first crimp barrel, and/or (ii) the second crimp barrel.

12. The assemblage as recited in claim 10, wherein the bridge element is separate from the first crimp barrel and of the second crimp barrel, as a third crimp barrel.

13. The assemblage as recited in claim 10, wherein at least one of: (i) the first crimp barrel, and/or (ii) the second crimp barrel, and/or (iii) the bridge element, are at least one of (i) annular, and/or (ii) cylindrical, and/or (iii) disposed around the shield wire.

14. The assemblage as recited in claim 10, wherein the assemblage is formed by:
   cutting the shield wire at the decoupling point along a run direction of the cable in such a way that the shield wire is completely cut through in a circumferential direction;
   positioning the first crimp barrel on the cable on the first side of the decoupling point in such a way that the first crimp barrel is electrically connected to the shield wire on the first side of the decoupling point;
   positioning the second crimp barrel on the cable on a second side of the decoupling point in such away that the second crimp barrel is electrically connected to the shield wire on the second side of the decoupling point; and
   creating a capacitive bridging of the shield wire across the decoupling point in such a way that the first crimp barrel and the second crimp barrel are capacitively coupled.

* * * * *

UNITED STATES PATENT AND TRADEMARK OFFICE
CERTIFICATE OF CORRECTION

PATENT NO.         : 10,309,991 B2
APPLICATION NO.    : 16/135199
DATED              : June 4, 2019
INVENTOR(S)        : Joachim Breithaupt It is certified that error appears in the above-identified patent and that said Letters Patent is hereby corrected as shown below:

In Claim 1, Column 8, Line 32, please replace "the shield wired" with "the shield wire"

Signed and Sealed this
Thirtieth Day of July, 2019

Andrei Iancu
*Director of the United States Patent and Trademark Office*